US006179629B1

(12) United States Patent
Lai et al.

(10) Patent No.: US 6,179,629 B1
(45) Date of Patent: Jan. 30, 2001

(54) ELECTRICAL CONNECTOR WITH IMPROVED CONTACT TAIL ALIGNING EFFECTIVENESS

(75) Inventors: C. Y. Lai; Kun-Tsan Wu, both of Tu-Chen (TW)

(73) Assignee: Hon Hai Precision Ind. Co., Ltd., Taipei Hsien (TW)

( * ) Notice: Under 35 U.S.C. 154(b), the term of this patent shall be extended for 0 days.

(21) Appl. No.: 09/104,890

(22) Filed: Jun. 25, 1998

(30) Foreign Application Priority Data

Jun. 25, 1997 (TW) ........................................ 86210605
Oct. 14, 1997 (TW) ........................................ 86217516

(51) Int. Cl.[7] .......................... H01R 12/00; H05K 1/00
(52) U.S. Cl. .......................................... 439/79
(58) Field of Search .......................... 439/79, 80, 607, 439/660, 295

(56) References Cited

U.S. PATENT DOCUMENTS 4,116,516 * 9/1978 Griffin .............................. 439/67
4,201,432 * 5/1980 Chalmers .............................. 439/79
4,390,224 * 6/1983 Showman et al. .................. 439/264
5,114,355 * 5/1992 Kimmel et al. ...................... 439/79
5,127,839 * 7/1992 Korsunsky et al. .................. 439/79
5,147,220 * 9/1992 Lybrand .............................. 439/607
5,219,295 * 6/1993 Niwa et al. .......................... 439/79
5,370,557 * 12/1994 Olsson .............................. 439/681
5,387,137 * 2/1995 Bouwknegt et al. ................ 439/736
5,643,008 * 7/1997 Tan et al. .......................... 439/541.5
5,643,010 * 7/1997 Wu .................................... 439/79
5,688,130 * 11/1997 Huang .............................. 439/79
5,692,912 * 12/1997 Nelson et al. ...................... 439/79
5,800,207 * 9/1998 Hsu et al. .......................... 439/607
5,879,171 * 3/1999 Wu .................................... 439/79

* cited by examiner

*Primary Examiner*—Steven L. Stephan
*Assistant Examiner*—Hae Moon Hyeon

(57) ABSTRACT

A high density board-to-board connector has a housing integrally defining two upper stepped faces and two lower stepped faces. Each face defines a number of contact passageways extending to a rear face of the housing. A spacer has two mounting blocks and a stair-like spacing section between the two mounting blocks. The spacing section integrally forms four steps each defining a number of vertically extending contact tail portion receiving holes. A number of contacts are each bent to have a contact portion and a tail portion perpendicular to the contact portion. The contacts are interferentially mounted in the housing at a position wherein the contact portions are received in a front end of the contact passageways, and the tail portions vertically extend behind the rear face of the housing. The housing together with the contacts is mounted to the spacer between the mounting blocks wherein the tail portions of the contacts received in the contact passageways in different faces are received in the tail portion receiving holes in corresponding steps.

1 Claim, 9 Drawing Sheets

ELECTRICAL CONNECTOR WITH IMPROVED CONTACT TAIL ALIGNING EFFECTIVENESS

BACKGROUND OF THE INVENTION

1. Field of The Invention

The present invention relates to an electrical connector, and particularly to a high density board-to-board connector.

2. The Prior Art

High density board-to-board connectors are proposed to meet the development of portable computers which require that the connectors used therein occupy the smallest amount of space possible and directly connect a daughter board to a mother board avoiding the use of cables.

Conventional high density board-to-board connectors are disclosed in U.S. Utility Pat. Nos. 5,219,294 and 5,567,168 and U.S. Design Pat. Nos. D332,599, D364,378 and D367,263. However, such conventional high density board-to-board connectors have a complicated structure and, thus, a high manufacturing cost.

Furthermore, in order to correctly solder such conventional connectors onto a printed circuit board (PCB), each connector is equipped with a spacer to precisely space tail portions of contacts thereof from each other a predetermined distance. However, as shown in FIG. 1, when the contacts 30 are bent to have tail portions 301 perpendicular to body portions 302 thereof, the tail portions 301 of the two rear rows of contacts 30 have a length which is too long resulting in excessive flexibility thereof. It becomes tedious to correctly extend tail portions having excessive flexibility into contact tail portion receiving holes defined in a spacer 40.

To overcome this disadvantage, an improvement has been proposed to bend the contacts 30' twice whereby the tail portions 301' thereof have the same length, as shown in FIG. 2. Therefore, the tail portions 301' can be easily assembled to the spacer 40. However, bending the contacts twice increases manufacturing costs.

Hence, an improved high density board-to-board connector is needed to eliminate the above mentioned defects of current high density board-to-board connectors.

SUMMARY OF THE INVENTION

Accordingly, an objective of the present invention is to provide a high density board-to-board connector which has a simple structure and a low manufacturing cost.

Another objective of the present invention is to provide a high density board-to-board connector which has a stair-like spacer with four steps each defining a number of contact tail portion receiving holes whereby tail portions of contacts of the connector can be easily inserted into the spacer and accurately spaced thereby when the contacts are bent and their tail portions received in the two rear rows of receiving holes have an excessive flexibility.

To fulfill the above mentioned objectives, according to a preferred embodiment of the present invention, a high density board-to-board plug connector comprises a generally T-shaped housing having a front face for engaging with a mating connector and a rear face opposite the front face. The T-shaped housing further integrally forms two stepped upper faces and two stepped lower faces each defining a number of contact passageways extending to the rear face of the housing. A number of contacts each having a contact portion and a tail portion are interferentially mounted in the housing at a position wherein the contact portions are received in the contact passageways and the tail portions vertically extend behind the rear face. A spacer has a stair-like configuration defining four steps, wherein each step has a number of vertically defined contact tail portion receiving holes. When the housing together with the contacts is mounted to the spacer, the tail portions of the contacts in different faces of the housing extend into the contact tail portion receiving holes in corresponding steps.

A board-to-board receptacle connector includes a generally U-shaped housing defining two stepped upper faces and two stepped lower faces in a recess of the housing. Each face has a number of contact passageways defined therein and extending to a rear face of the housing. The U-shaped housing further has a mating connector engaging face defined by an end wall of the recess. A number of contacts are interferentially mounted in the housing at a position wherein contact portions thereof are received in a front part of the contact passageways, and tail portions thereof vertically extend behind the rear face. A spacer has a configuration the same as the spacer used with the plug connector. When the U-shaped housing together with the contacts is mounted to the spacer, the tail portions of the contacts in different faces of the housing extend into the contact tail portion receiving holes in corresponding steps. When the plug connector mates with the receptacle connector, the T-shaped housing extends into the recess of the U-shaped housing to cause the engaging faces of the two connectors to engage with each other and the contacts to electrically connect with each other.

BRIEF DESCRIPTION OF THE DRAWINGS

FIG. 7 (B) is a view similar to FIG. 7(A) showing the mated receptacle and plug connectors.

DETAILED DESCRIPTION OF THE PREFERRED EMBODIMENT

Reference will now be made in detail to the preferred embodiment of the present invention.

Figure 2:
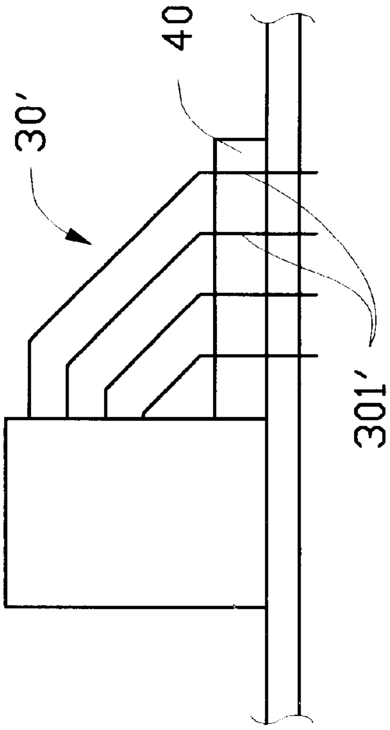
FIG.2 (PRIOR ART)
FIG. 2 is a schematic side view showing a second type of conventional board-to-board connector mounted to a PCB.
Figure 1:
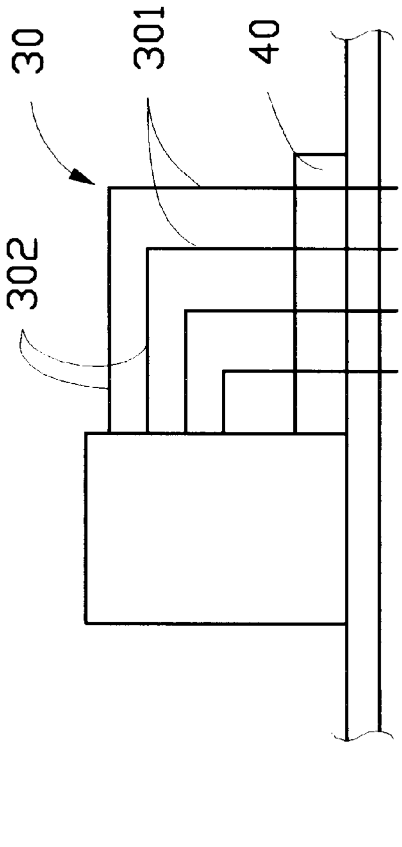
FIG.1 (PRIOR ART)
FIG. 1 is a schematic side view showing a first type of conventional board-to-board connector mounted to a PCB.
Figure 3:
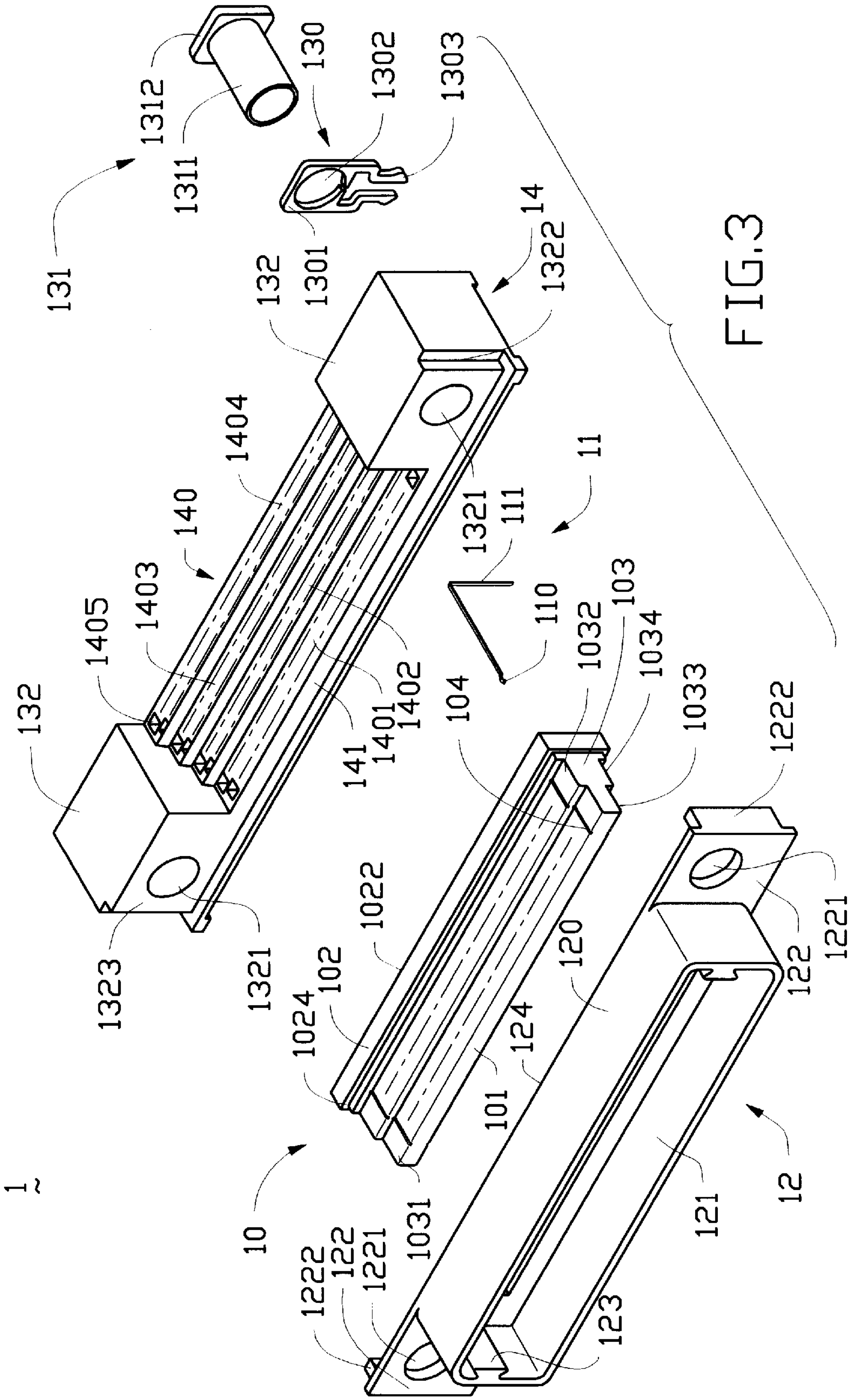
FIG. 3 is an exploded, perspective view of a board-to-board plug connector in accordance with the present invention.

Referring to FIG. 3, a high density board-to-board plug connector 1 in accordance with the present invention includes a metallic shielding 12, a dielectric housing 10, a number of contacts 11 (only one shown) each having a contact portion 110 and a tail portion 111, a dielectric spacer 14, a pair of board locks 130 (only one shown) and a pair of mounting posts 131 (only one shown).

The contact portion 110 of each contact 11 electrically engages with a corresponding contact in a mating connector, and the tail portion 111 thereof is soldered to a PCB. Each contact 11 is bent whereby the tail portion 111 is perpendicular to the contact portion 110.

The shielding 12 is formed to have a body 120 defining a mating connector receiving space 121 therein. Two tenons 123 extend from two lateral sides of the body 120 into the space 121. Two mounting ears 122 outwardly extend from lateral ends of the body 120. Each ear 122 defines a hole 1221 therein, and an engaging flange 1222 projecting rearward from a lateral edge thereof.

The housing 10 is formed to have a rear wall 102 and a T-shaped body portion 103 projecting from the rear wall 102. The housing 10 has a front face 101 for engaging with a mating connector and a rear face 1022 opposite the front face 101. The body portion 103 has upper front and rear faces 1031, 1032 constituting a stair-like configuration, and lower front and rear faces 1033, 1034 also constituting a stair-like configuration, wherein the upper front face 1031 aligns with the lower front face 1033, and the upper rear face 1032 aligns with the lower rear face 1034. Furthermore, the upper front face 1031 and the lower front face 1033 define a thickness which is smaller than that defined by the upper and lower rear faces 1032, 1034. A number of contact passageways 104 are defined in each of the faces 1031, 1032, 1033 and 1034 and extend to the rear face 1022. The rear wall 102 further defines a stop face 1024 near the body portion 103.

The spacer 14 has two lateral mounting blocks 132 each defining a horizontally extending mounting hole 1321 and a fitting recess 1322 at a front, outer corner thereof. A mounting face 141 is defined at a lower portion of a front face of the spacer 14. A stair-like spacing section 140 is formed between the mounting blocks 132 and defines four steps 1401, 1402, 1403 and 1404 each defining a number of contact tail portion receiving holes 1405 extending vertically therethrough.

Each board lock 130 is formed by stamping a metal sheet to have a body portion 1301 defining a central hole 1302 and two retention legs 1303 extending downward from the body portion 1301. The retention legs 1303 are used to retentively engage with a PCB.

Each mounting post 131 is formed to have a square mounting plate 1312 and a mounting sleeve 1311 projecting from the mounting plate 1312.

Figure 4A:
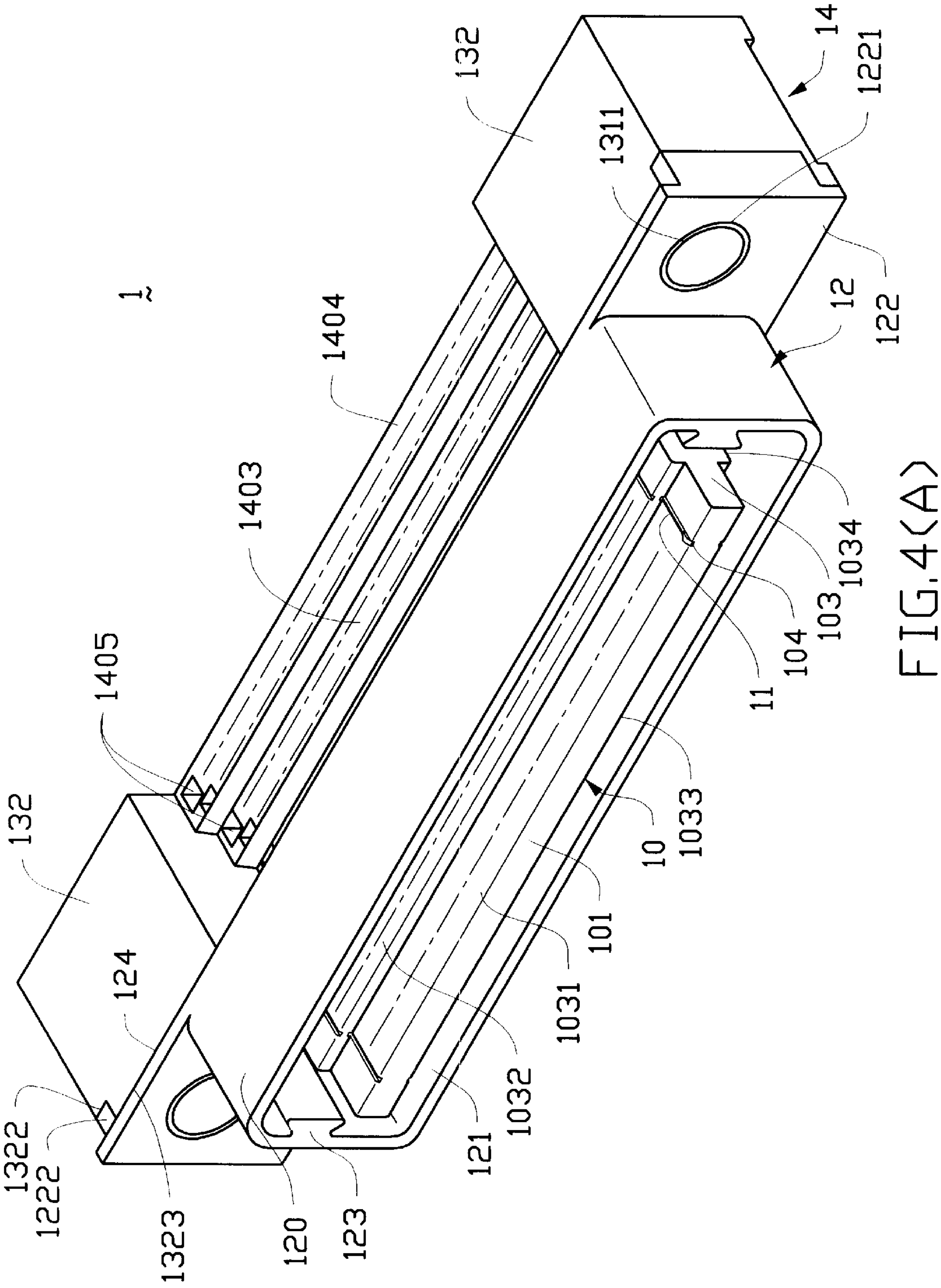
FIG. 4(A) is a perspective view of the assembled plug board-to-board connector of FIG. 3.
Figure 4B:
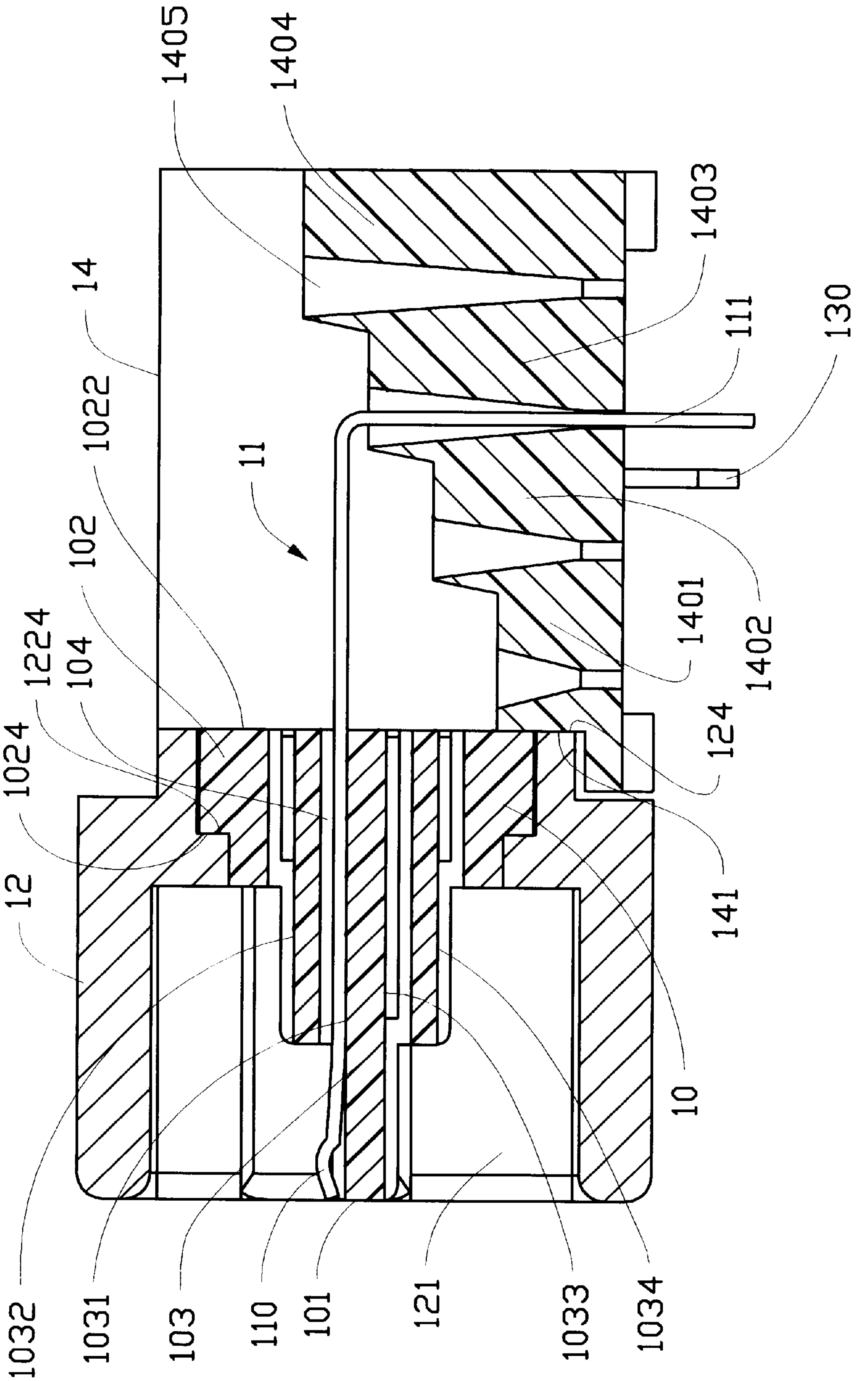
FIG. 4(B) is a cross-sectional view of the assembled plug connector of FIG. 4(A)

To assemble the plug connector 1, also referring to FIGS. 4(A) and 4 (B), the board locks 130 are firstly mounted to the spacer 14 by fitting the body portions 1301 of the board locks 130 from a bottom of the spacer 14 into the respective mounting blocks 132 to reach a position wherein the holes 1302 of the board locks 130 are aligned with the corresponding holes 1321 of the mounting blocks 132. The contacts 11 are then interferentially fitted into the housing 10 to reach a position wherein the tail portions 111 thereof extend vertically behind the rear face 1022 of the housing 10 and the contact portions 110 thereof are received in a front end of the contact passageways 104. Thereafter, the housing 10 together with the contacts 11 is mounted to the spacer 14 by extending the tail portions 111 of the contacts 11 into the contact tail portion receiving holes 1405 to reach a position wherein the rear face 1022 of the housing 10 engages with an upper part of the mounting face 141 of the spacer 14. Although it is not wholly shown in the drawings, it is understood that after the contacts 11, the housing 10 and the spacer 14 are assembled, the tail portions 111 of the contacts 11 received in the contact passageways 104 in the face 1032 are received in the holes 1045 in the step 1404; the tail portions 111 of the contacts 11 received in the contact passageways 104 in the face 1031 are received in the holes 1045 in the step 1403; the tail portions 111 of the contacts 11 received in the contact passageways 104 in the face 1033 are received in the holes 1045 in the step 1402; and the tail portions 111 of the contacts 11 received in the contact passageways 104 in the face 1034 are received in the holes 1045 in the step 1401. Afterwards, the shielding 12 is assembled to the housing 10 and the spacer 14 to reach a position wherein the flanges 1222 are fittingly received in the recesses 1322. A rear face 124 of the shielding 12 engages with a lower part of the mounting face 141 of the spacer 14 and a front face 1323 of each of the mounting blocks 132. An inner stepped portion 1224 of the shielding 12 engages with the stop face 1024 of the housing 10. The body portion 103 of the housing 10 extends into the mating connector receiving space 121 defined by the shielding 12 between the tenons 123. The holes 1221 defined in the ears 122 of the shielding 12 are aligned with the corresponding holes 1321 defined in the mounting blocks 132 of the spacer 14. Finally, the sleeves 1311 of the mounting posts 131 are pressed into the holes 1321 of the mounting blocks 132, the holes 1302 of the board locks 130 and the holes 1221 of the ears 122 to interferentially engage with the mounting blocks 132, the board locks 130 and the ears 122, thereby fixedly connecting the spacer 14, the board locks 130 and the shielding 12 together. Thus, the assembly of the plug connector 1 is completed.

Figure 5:
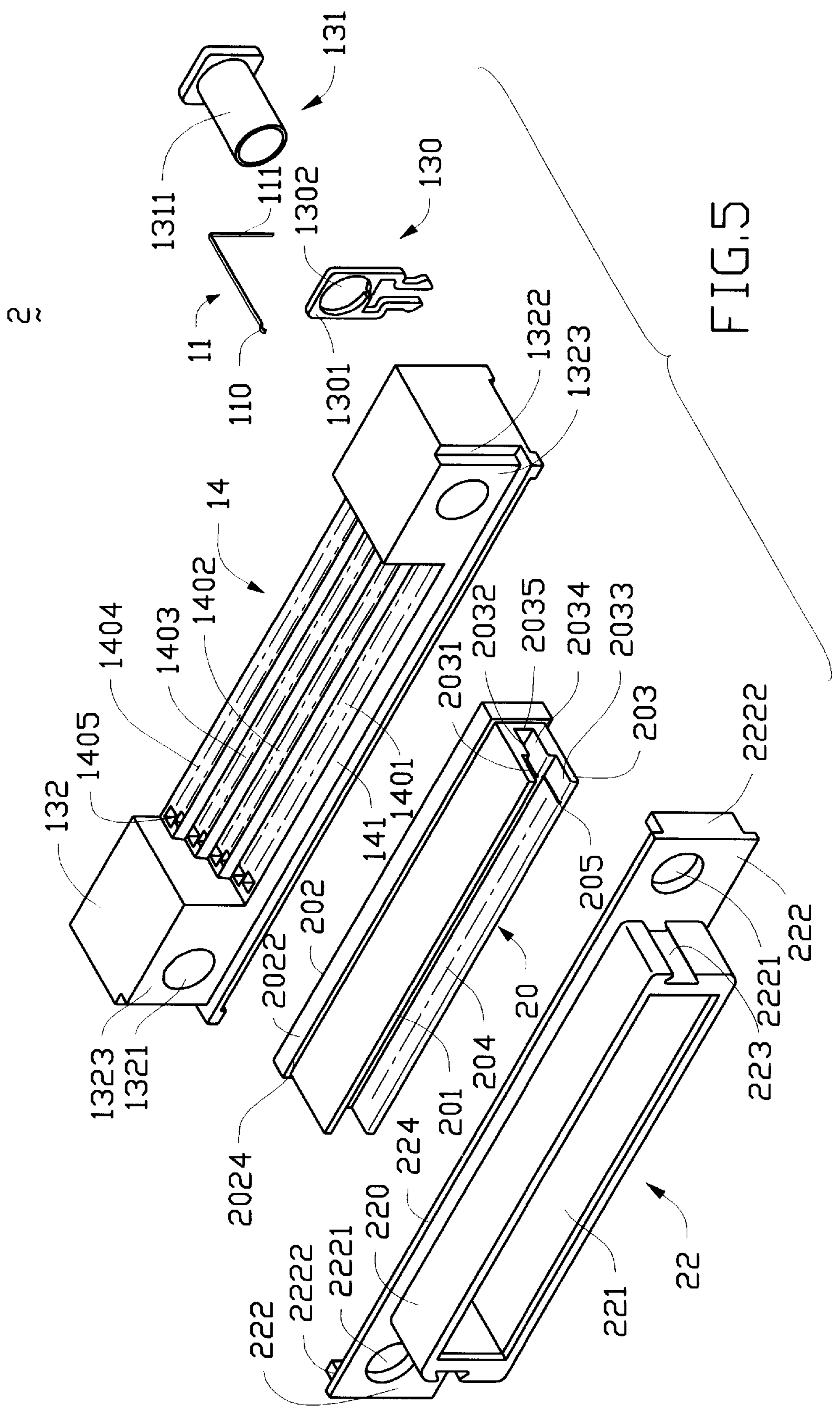
FIG. 5 is an exploded, perspective view of a board-to-board receptacle connector in accordance with the present invention.

Referring to FIG. 5, a high density board-to-board receptacle connector 2 in accordance with the present invention includes a metallic shielding 22, a dielectric housing 20, a number of contacts 11 (only one shown) each having a contact portion 110 and a tail portion 111, a dielectric spacer 14, a pair of board locks 130 (only one shown) and a pair of mounting posts 131 (only one shown). The spacer 14, the contacts 11, the board locks 130 and the mounting posts 131 each have a structure generally the same as those of the plug connector 1, so detailed descriptions thereof are omitted here.

The shielding 22 is formed to have a body 220 defining a housing receiving space 221 therein. Two mortises 223 are defined in outer lateral walls of the body 220, respectively. Two mounting ears 222 outwardly extend from the body 220. Each ear 222 defines a hole 2221 therein, and an engaging flange 2222 projecting rearward from a lateral edge thereof.

The housing 20 is formed to have a rear wall 202 and a U-shaped body portion 203 projecting from the rear wall 202. The housing 20 has a front face 201 and a rear face 2022 opposite the front face 201. The body portion 203 has a recess 204 defined by upper front and rear faces 2031, 2032 constituting a stair-like configuration, lower front and rear faces 2033, 2034 also constituting a stair-like configuration and an end face 2035 between the upper and lower rear faces 2032, 2034. The end face 2035 is used for engaging with a mating connector. The upper front face 2031 is opposite the lower front face 2033, and the upper rear face 2032 is opposite the lower rear face 2034. Furthermore, the upper front face 2031 is spaced from the lower front face 2033 a distance which is wider than the space between the upper and lower rear faces 2032, 2034. A number of contact passageways 205 are defined in each of the faces 2031, 2032, 2033 and 2034 and extend to the rear face 2022. The rear wall 202 further defines a stop face 2024 near the body portion 203.

Figure 6A:
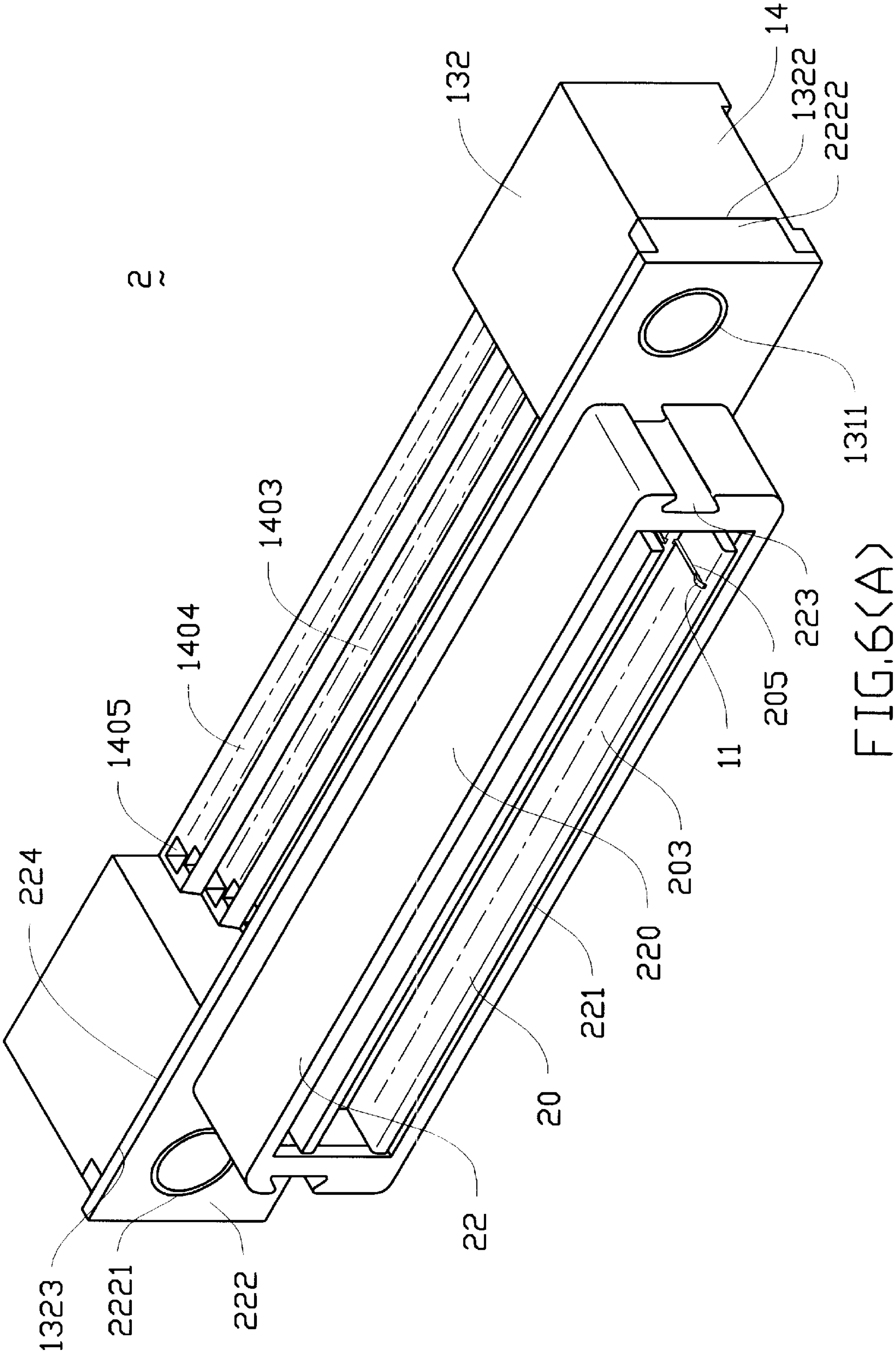
FIG. 6(A) is a perspective view of the assembled receptacle connector of FIG. 5.
Figure 6B:
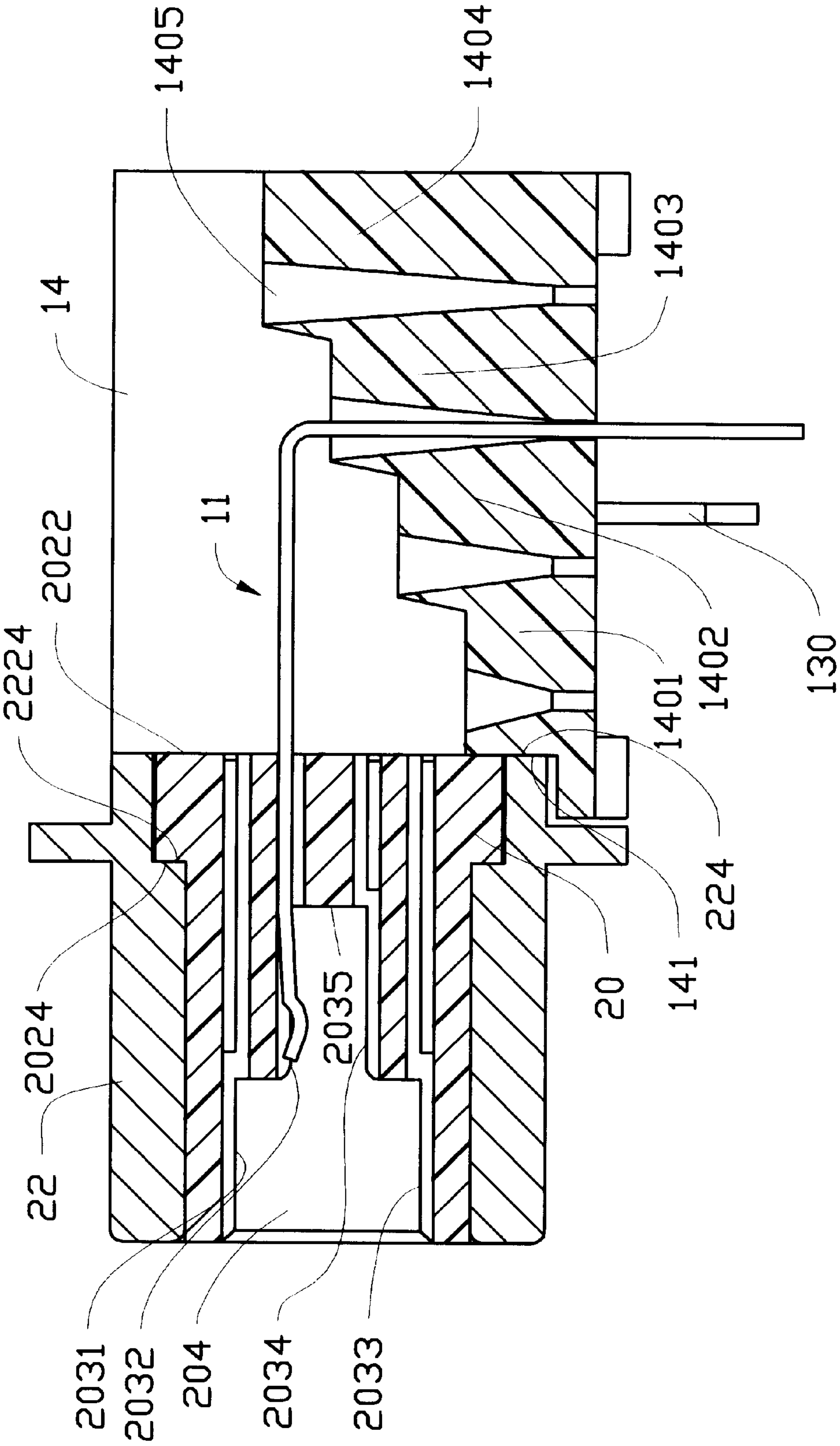
FIG. 6(B) is a cross-sectional view of the assembled receptacle connector of FIG. 6(A)

To assemble the receptacle connector 2, also referring to FIGS. 6(A) and 6(B), the board locks 130 are firstly mounted to the spacer 14 by fitting the body portions 1301 of the board locks 130 from a bottom of the spacer 14 into the respective mounting blocks 132 to reach a position wherein the holes 1302 of the board locks 130 are aligned with the corresponding holes 1321 of the mounting blocks 132. The contacts 11 are then interferentially fitted to the housing 20 to reach a position wherein the tail portions 111 extend vertically behind the rear face 2022 of the housing 20 and the contact portions 110 are received in a front end of the contact passageways 205. Thereafter, the housing 20 together with the contacts 11 is mounted to the spacer 14 by extending the tail portions 111 of the contacts 11 into the contact tail portion receiving holes 1405 to reach a position wherein the rear face 2022 of the housing 20 engages with an upper part of the mounting face 141 of the spacer 14. Although it is not wholly shown in the drawings, it is understood that after the contacts 11, the housing 20 and the spacer 14 are assembled, the tail portions 111 of the contacts 11 received in the contact passageways 205 in the face 2031 are received in the holes 1045 in the step 1404; the tail portions 111 of the contacts 11 received in the contact passageways 205 in the face 2032 are received in the holes 1045 in the step 1403; the tail portions 111 of the contacts 11 received in the contact passageways 205 in the face 2034 are received in the holes 1045 in the step 1402; and the tail portions 111 of the contacts 11 received in the contact passageways 205 in the face 2033 are received in the holes 1045 in the step 1401. Afterwards, the shielding 22 is assembled to the housing 20 and the spacer 14 to reach a position wherein the flanges 2222 are fittingly received in the recesses 1322. A rear face 224 of the shielding 22 engages with a lower part of the mounting face 141 of the spacer 14 and a front face 1323 of each of the mounting blocks 132. An inner stepped portion 2224 of the shielding 22 engages with the stop face 2024 of the housing 20. The body portion 203 of the housing 20 extends into the housing receiving space 221 of the shielding 22. The holes 2221 defined in the ears 222 of the shielding 22 are aligned with the corresponding holes 1321 of the mounting blocks 132 of the spacer 14. Finally, the sleeves 1311 of the mounting posts 131 are pressed into the holes 1321 of the mounting blocks 132, the holes 1302 of the board locks 130 and the holes 2221 of the ears 222 to interferentially engage with the mounting blocks 132, the board locks 130 and the shielding 22, thereby fixedly connecting the spacer 14, the board locks 130 and the shielding 22 together. Thus, the assembly of the receptacle connector 2 is completed.

Figure 7A:
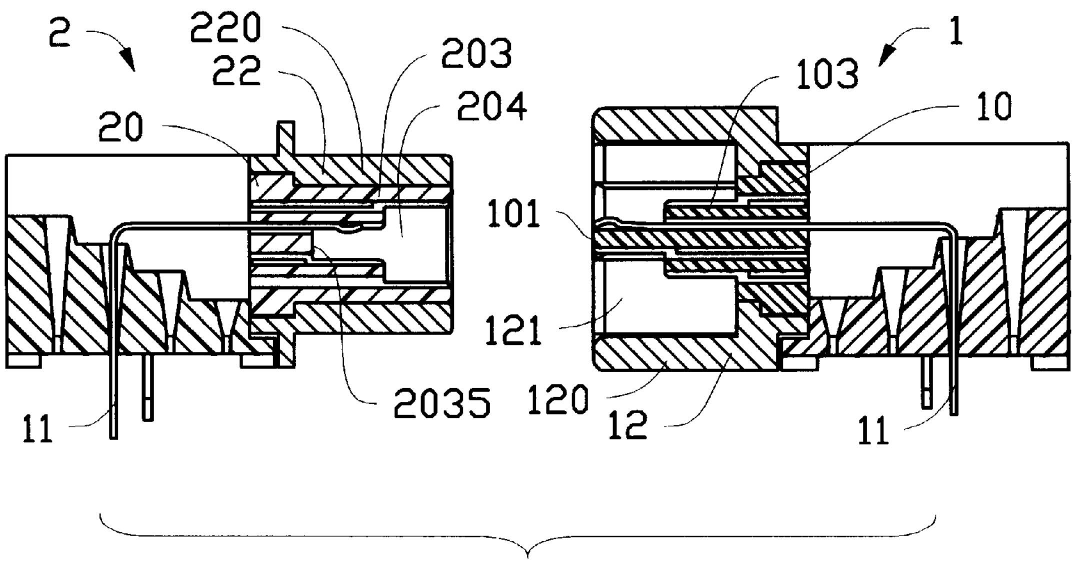
FIG. 7 (A) is a cross-sectional view of the receptacle and plug connectors before mating with each other.
FIG. 7(C) is a perspective view of the mated plug and receptacle connectors.
Figure 7B:
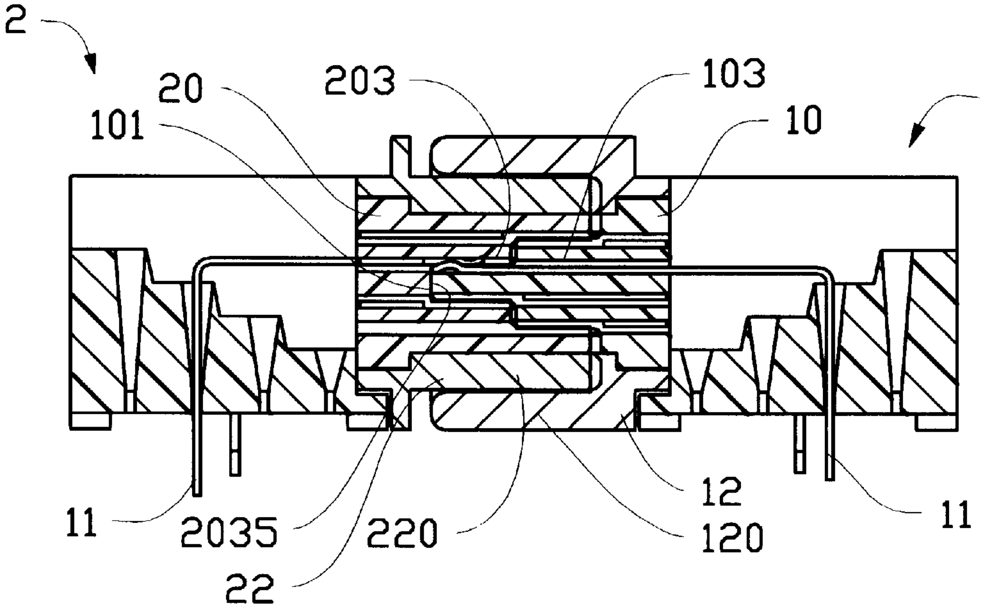
Figure 7C:
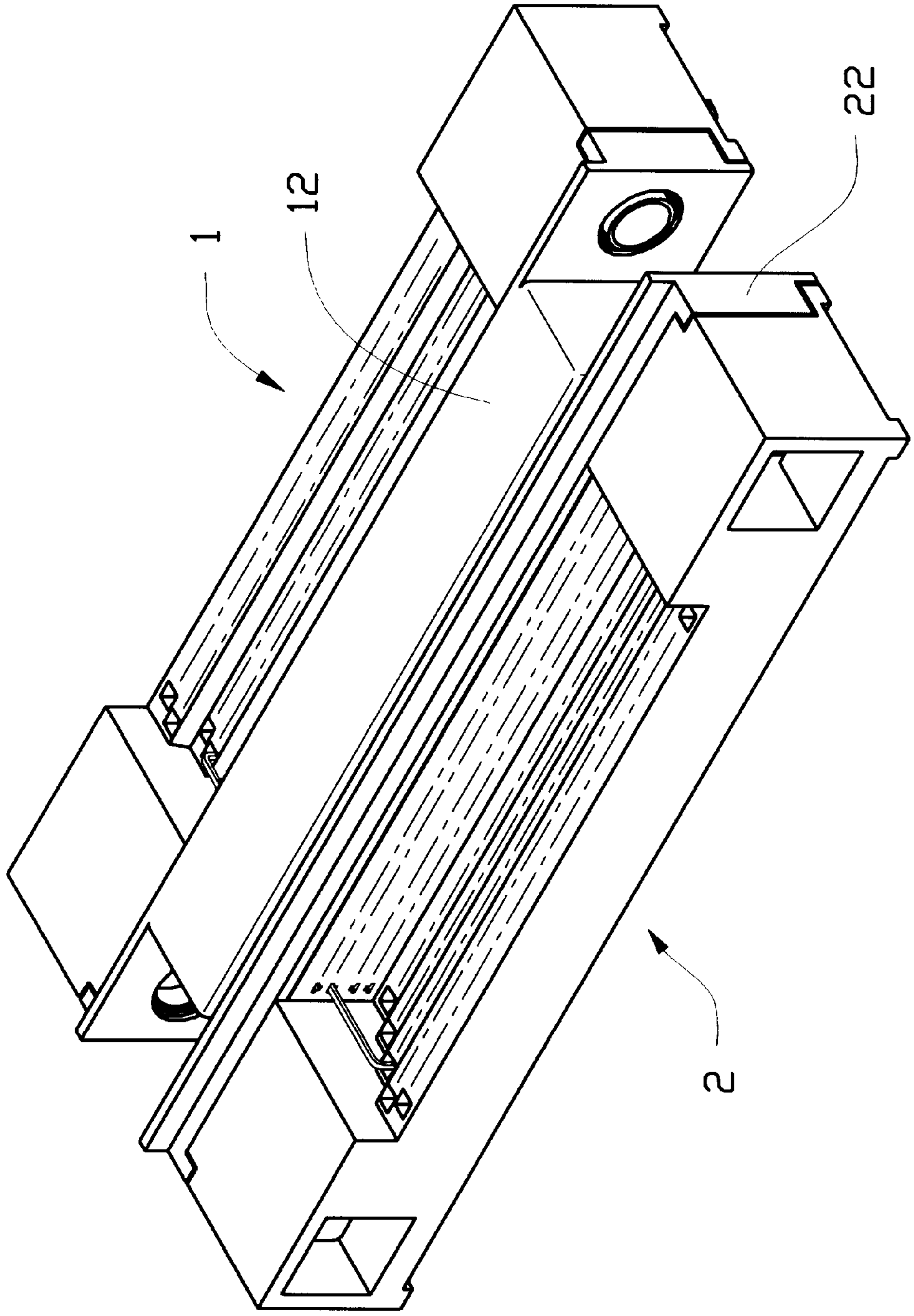

To mate the plug and receptacle connectors 1 and 2, as shown in FIGS. 7(A) to 7(C), the tenons 123 are fitted into the mortises 223 to reach a position wherein the front face 101 of the housing 10 engages with the end face 2035 in the recess 204 of the body portion 203 of the housing 20. Therefore, the T-shaped body portion 103 of the housing 10 of the plug connector 1 is received in the recess 204 defined by the U-shaped body portion 203 of the housing 20 of the receptacle connector 2, and the body 220 of the shielding 22 of the receptacle connector 2 is received in the mating connector receiving space 121 defined by the body 120 of the shielding 12 of the plug connector 1. The different rows of contacts 11 in the plug connector 1 are electrically engaged with the corresponding rows of contacts 11 in the receptacle connector 2.

In the present invention, as each of the housings 10, 20 respective of the plug and receptacle connectors 1, 2 is integrally formed with a pair of two stepped faces to receive four rows of contacts, the structure of the connectors in accordance with present invention is simpler than the prior art; thus, the present invention can reduce manufacturing costs.

Furthermore, in the present invention, as the spacers 14 are configured to have a stair-like configuration with four steps, when mounting the contacts 11 to the spacer 14, the two rear rows of contacts which have longer tail portions can have their tail portions firstly received in and guided by the contact tail portion receiving holes in the spacer thereby facilitating effortless mounting of the contacts to the spacer.

While the present invention has been described with reference to a specific embodiment, the description is illustrative of the invention and is not to be construed as limiting the invention. Various modifications to the present invention can be made to the preferred embodiment by those skilled in the art without departing from the true spirit and scope of the invention as defined by the appended claims.

What is claimed is:

1. A connector including:

a housing defining a number of contact passageways;

a corresponding number of contacts received within the corresponding passageways, respectively;

a shield including two mounting ears at two opposite ends and defining a space therein; and an independent spacer separated from the housing and including two mounting blocks at two opposite ends, said spacer defining a spacing section therebetween; wherein said housing is substantially fully embedded within the shield, and the shield and the spacer are fastened together by means of said two mounting ears and said two mounting blocks directly abutting against each other; and wherein said spacer directly abuts against a rear portion of the housing for preventing backward movement of the housing with regard to the shield.

* * * * *